United States Patent
Ho et al.

(10) Patent No.: US 6,294,477 B1
(45) Date of Patent: Sep. 25, 2001

(54) LOW COST HIGH DENSITY THIN FILM PROCESSING

(75) Inventors: Chung W. Ho, Monte Sereno; Ujwal Anant Deshpaude; Chang-Ming Lin, both of Fremont, all of CA (US)

(73) Assignee: Thin Film Module, Inc., Hsin-Chu (TW)

( * ) Notice: Subject to any disclaimer, the term of this patent is extended or adjusted under 35 U.S.C. 154(b) by 0 days.

(21) Appl. No.: 09/467,121

(22) Filed: Dec. 20, 1999

(51) Int. Cl.⁷ .................................................. H01L 21/31
(52) U.S. Cl. ................................................................ 438/745
(58) Field of Search ...................... 438/687, 745

(56) References Cited

U.S. PATENT DOCUMENTS

| | | | |
|---|---|---|---|
| 5,485,038 | 1/1996 | Licari et al. | 257/758 |
| 5,509,553 | 4/1996 | Hunter, Jr. et al. | 216/13 |
| 5,525,834 | 6/1996 | Fischer et al. | 257/691 |
| 5,724,232 | 3/1998 | Bhatt et al. | 361/762 |
| 5,830,563 | 11/1998 | Shimoto et al. | 428/209 |
| 5,837,427 | 11/1998 | Hwang et al. | 430/312 |
| 5,877,551 | 3/1999 | Tostado et al. | 257/701 |
| 6,040,243 | * 3/2000 | Li et al. | 438/687 |

* cited by examiner

Primary Examiner—Felisa Hiteshew
(74) Attorney, Agent, or Firm—George O. Saile; Stephen B. Ackerman

(57) ABSTRACT

A new method is provided for high-density thin film interconnect processing. A thin layer of epoxy is deposited over a substrate surface, a via pattern is created in the epoxy layer, the surface of the epoxy is subjected to a process of swell and etch. A metal plating base is formed on the surface of the dielectric using electroless seeding for the metal deposition. A layer of photoresist is deposited over the plating base and is patterned and etched to create the pattern of the interconnect lines. Semi-additive plating of the interconnect pattern is performed to the plating base. The photoresist is removed. The plating base is removed from between the pattern of the interconnect lines using micro etching thereby creating the interconnect lines. A layer of dielectric is deposited over the surface of the created layer of interconnect lines. A via pattern is created in the dielectric layer. The process may be repeated more than once. Electrical contacts are made to the top metal pads through the top vias.

20 Claims, 6 Drawing Sheets

LOW COST HIGH DENSITY THIN FILM PROCESSING

BACKGROUND OF THE INVENTION (1) Field of the Invention

The invention relates to the fabrication of integrated circuit devices and more particularly, to a method of creating thin interconnect lines using thin film processing technology.

(2) Description of the Prior Art

Development of semiconductor devices has for quite some time be characterized by obtaining device performance improvements by means of device miniaturization. Device miniaturization has brought with it increasing device densities which in turn has resulted in devices that contain multiple levels of metal interconnect networks that are located above the surface of the semiconductor substrate. Modern device design has progressed where device dimensions are now in the sub and deep submicron range down to for instance 0.25 um. With this it is not uncommon to have three or four levels of device interconnect layers within one device construction.

When the dimensions of the Integrated Circuits are scaled down, the cost per die is decreased while some aspects of performance are improved. The metal connections which connect the Integrated Circuit to other circuit or system components become of relative more importance and have, with further miniaturization of the IC, an increasingly negative impact on the circuit performance. The parasitic resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

Increased device density has not only led to increased use of different material that are used for interconnect lines, the effort has also led to the development of a number of different device packages. As a for instance, increased Input-Output (I/O) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Thermal Coefficient of Expansion) matching to avoid solder bump fatigue are still challenges. In mounting several packages together, such as surface mounting a ceramic package to a plastic board, the TCE mismatch can cause a large mechanical stress on the solder-lead joints that can lead to joint breakage caused by solder fatigue from temperature cycling operations.

Prior Art high density substrates such as those used for thin film MCM's (multi-chip modules) are processed on six or eight inch wafers. Dielectric coatings with materials such as polyimides and BCB are used. Vias are created in the dielectric layers by a photolithographic approach for the photosensitive polyimide or BCB. Alternatively, a layer of photoresist is deposited and patterned on the dielectric material and a plasma dry etching step is used to create the vias.

The metal interconnect process is usually performed by sputtering a metal deposition with Cr/Cu or Ti/Cu. A masking pattern is created on the sputtered plating base which is followed by a semi-additive plating step. A wet etch step is used to etch off the plating base and a plasma step is used after the wet etch to remove a thin layer of the dielectric layer on the top surface in order to get rid of the remains of the sputtered film that has penetrated into the dielectric causing leakage current.

The wafer based thin film MCM approach can create high density interconnect substrates but the substrates that are manufactured are very expensive because of the equipment used and because of the small wafer size.

Another Prior Art substrate packaging uses ceramic and plastic Ball Grid Array (BGA) packaging. Ceramic substrate packaging is expensive and has proven to limit the performance of the overall package. Recent years have seen the emergence of plastic substrate BGA packaging; this type of packaging has become the mainstream design and is frequently used in high volume BGA package fabrication. The plastic substrate BGA package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 mm.), the plastic BGA structure becomes complicated and expensive. This can be traced to the multi-layer structure used to create the plastic BGA package. This multi-layer structure for the plastic BGA interconnect package is referred to as the Build Up Multilayer or BUM approach and results in a line density within the package of typically 2–3 mil or 50 u–75 u range. This line density is not sufficiently high for realizing the fan out from the chip I/O to the solder balls on the package within a single layer. This leads to the multi-layer approach. The multi-layer approach brings with it the use of relatively thick (50 u–75 u) dielectric layers, these layers have a TCE (Thermal Coefficient of Expansion) that is considerably higher than the TCE of the laminate board on which the plastic BGA package is mounted. To counteract this difference in TCE's the BUM layers must be (thermally and mechanically) balanced on the other side (the side of the board that does not usually require an interconnect density provided by the BUM layers) of the laminate board. This latter requirement results in the use of additional material and processing steps to apply these materials, increasing the cost of the BGA package and creating a yield detractor.

Another approach is the use of a flexible film as the starting material. A polymer film, such as the polyimide film or an epoxy based film of 2 to 3 mil thick with or without a copper layer attached to it, is processed by metalization and patterning on one or both sides. A completed two metal layer film, described as a layer pair, can be used as a packaging substrate material. Subsequent dielectric and copper layers can be build up on the processed first metal layer, such as the RCC (Resin Coated Copper) approach. Alternatively, two or more layer pairs can be bonded together to make a multilayer structure. The advantage of this approach is that it uses a minimum amount of material. However, because of the lack of stability of the film, the line and space density is limited to that of the BUM structure described herein, which is not sufficiently high for the high density packaging that is used to achieve a low cost substrate, having only a few interconnect layers.

Other Prior Art applications use thin film interconnect layers for flip chip or wire bond packaging substrates. These applications start with a laminate substrate onto which the thin film layers are deposited. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not, unlike the BUM approach, require to counter-balance thick layers of dielectric in order to establish dimensional stability. A disadvantage of the laminate substrate is that the process of mechanically drilling holes through the laminate substrate is time-consuming thereby adding cost to the process while it also limits the interconnect density that can be achieved. Further, the planarity of the laminate substrate does not meet planarity requirements for the deposition of thin films. Good planarity for the surface of the laminate substrate is established by depositing dielectrics and metal layers on the initial surface of the laminate structure, steps that again add to the processing cost of the BGA structure. Since the laminate substrate is composed using organic materials, the substrate is not dimensionally stable resulting in warpage and dimensional variations during high temperature processing and wet chemical interactions. This results in additional processing complications and costs.

The invention teaches a new method for forming high density interconnect networks using thin film processing techniques. The invention is aimed at sharply reducing the processing cost of forming thin film interconnect lines by using processing equipment and processing that are considerable less expensive than conventional methods.

U.S. Pat. No. 5,509,553 (Hunter, Jr. et al.) shows a (3) metal layer process (DEMR) (see FIG. 5A) that appears to comprise a) sputter plating base b) plating metal (semi-additive plating), see col. 2.

U.S. Pat. No. 5,830,563 (Shimoto et al.) discloses a laminate substrate with thin films deposited thereon.

U.S. Pat. No. 5,837,427 (Hwang et al.) shows a (4) BUM process for a PCB.

U.S. Pat. No. 5,724,232 (Bhatt et al.) shows a package with a (1) metal substrate.

U.S. Pat. No. 5,525,834 (Fischer et al.) shows a package having a Cu substrate, thin dielectric layers (1–25 um thick) and thin dielectric layers (12 to 75 um), see col. 7 and 8.

U.S. Pat. No. 5,877,551 (Tostado et al.) discloses a package having a metal substrate with (2) dielectric layers formed of polymers, epoxy (3 to 100 um), see col. 4.

U.S. Pat. No. 5,485,038 (Licari et al.) teaches a package using a photo-imageable epoxy dielectric layer.

SUMMARY OF THE INVENTION

A principle objective of the invention is to provide an inexpensive and reliable method for high-density interconnect line manufacturing.

Another objective of the invention is to reduce performance limitations imposed by Prior Art high-density interconnect line manufacturing.

Yet another objective of the invention is to provide for high pin fan-out for interconnect line manufacturing.

A new method is provided for high-density thin film interconnect processing. A thin layer of dielectric (such as an epoxy material) is deposited over a substrate surface such as a metal substrate; vias are patterned into the dielectric to expose the substrate surface; the surface of the dielectric is subjected to a process of swell and etch. A metal plating base is formed on the surface of the dielectric using electroless seeding for the metal deposition. A layer of photoresist is deposited over plating base and is patterned in the reverse pattern of the interconnect lines and is developed to create the reverse pattern of the interconnect lines. Semi-additive plating of the plating base is performed in the pattern of the interconnect lines. The photoresist is stripped away. The plating base is removed from between the pattern of the interconnect lines using micro etching thereby creating the interconnect lines. A layer of dielectric is deposited over the surface of the created layer of interconnect lines. A via pattern is processed on the dielectric layer and the process is repeated for the next layer of metalization if needed.

Using the approach of the invention eliminates the need for expensive vacuum equipment that is typically required for metal sputtering of the interconnect lines. The approach of the invention further eliminates the need for a plasma etch that is typically required to remove metal that has penetrated the dielectric during the metal sputtering, this because the method of the invention does not cause the penetration of metal into the underlying layer of dielectric while the voids, created in the step of etch and swell, does create the voids in the seeded layer that is required to enhance metal adhesion to the underlying layer of dielectric.

DESCRIPTION OF THE PREFERRED EMBODIMENTS

Figure 1A:
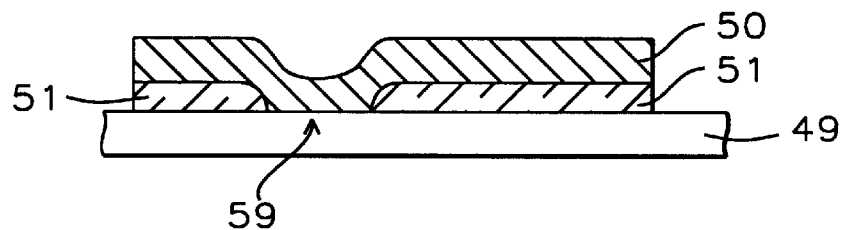
FIG. 1 shows the conventional processing steps used during the thin film deposition process.
Figure 1B:
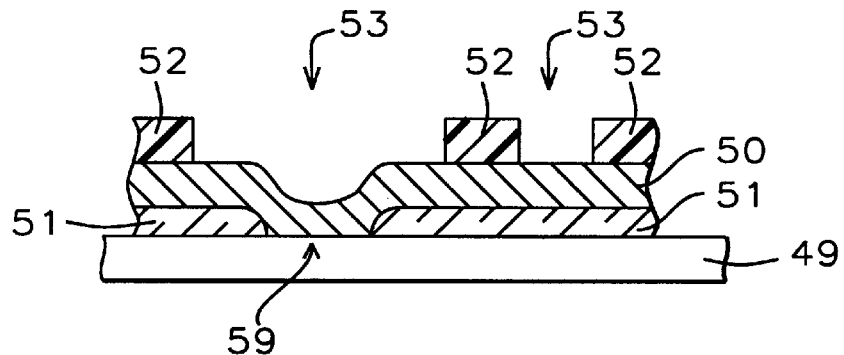
Figure 1C:
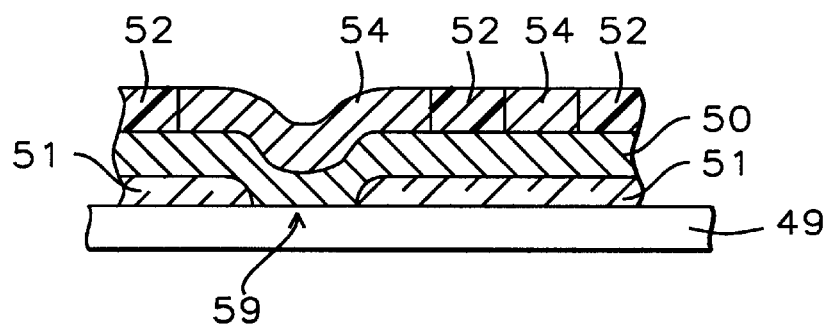
Figure 1D:
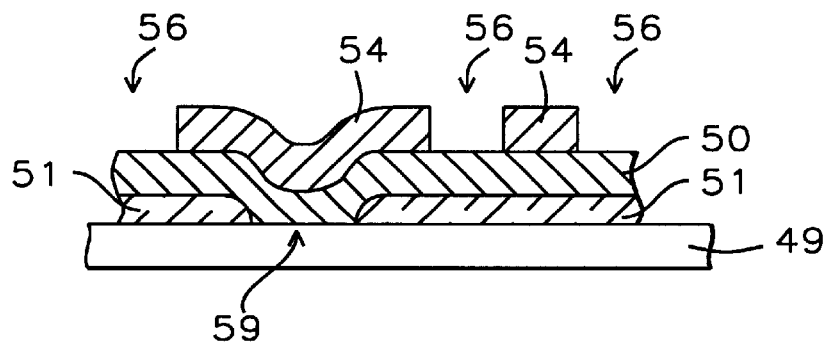
Figure 1E:
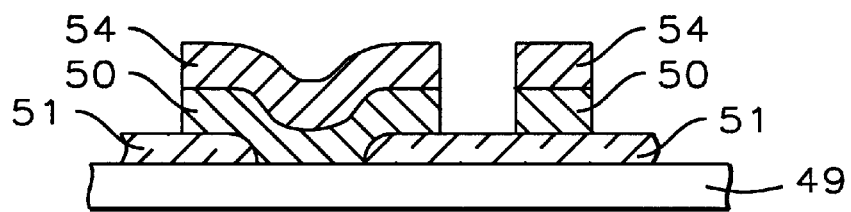
Figure 1F:
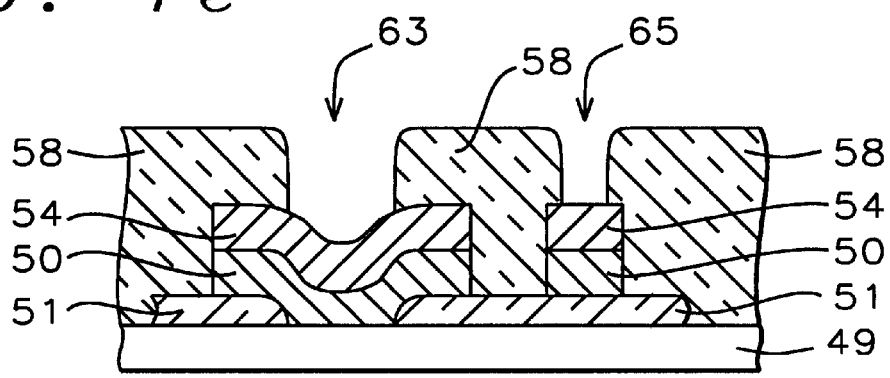

The conventional thin film deposition technique contains the following steps, see FIG. 1:

FIG. 1a, depositing an interconnect plating base 50 by consecutive sputtering of Cr and Cu over a layer of dielectric 51 that has been deposited on the surface 49 of a substrate surface; conventional processing uses expensive sputter and evaporator equipment to deposit the thin layer 50 of metal that serves as the plating base; a via 59 has been created in the layer 51 of dielectric;

FIG. 1b, a layer 52 of photoresist is deposited over the surface of the interconnect plating base 50; this layer 52 of photoresist is masked and patterned creating the pattern 53 of the interconnect lines;

FIG. 1c, semi-additive plating 54 of the interconnect pattern is performed by depositing Cu in the openings that have been created in the layer 52 of photoresist; this plating 54 plates the surface of the (copper) lines that are to be created for the interconnect pattern;

FIG. 1d, removing of the mask 52 (FIG. 1b) of photoresist that has been used as a mask for the semi-additive plating of the interconnect pattern; areas 56 are the regions in the plating-base layer 50 that must be removed to create the interconnect pattern;

FIG. 1e, wet etching to remove the sputtered base metal layer 56, FIG. 1d, from between the interconnect pattern 54;

FIG. 1f, coating the created interconnect pattern with a layer 58 of dielectric; vias 63 and 65 have been created in the layer 58 of dielectric for points of electrical contact by either using the photolithographic approach of exposing and developing or by using a laser for applications where wire bond connections need to be made to the interconnect pattern the top dielectric forms a solder mask and vias are created in the dielectric for the solder connections.

The above process can be repeated for more than one layer processing. For the top layer of metal of the pad metallurgy, a semi additive plating step is performed by depositing Cu, Ni and then Au.

During the first step of the above indicated sequence, the thin layer of metal of the plating base 50 typically penetrates the surface of the underlying dielectric 51. The presence of this metal in the surface of the dielectric 51 leads to high leakage current through the dielectric 51, to remove the possibility of leakage current the top part of the dielectric is therefore removed using a vacuum plasma process, the layer of the dielectric cannot be removed using a wet etch processing step.

Two key steps in the above-indicated processing sequence are:

the deposition of a thin layer of metal as the plating base over the surface of a dielectric, this step uses expensive sputter equipment, and the step of vacuum plasma etch to remove the top layer of the dielectric on the surface of which the interconnect lines are created.

Both of these steps use expensive processing equipment and therefore add significantly to the overall cost of creating the interconnect lines.

Vacuum equipment that is conventionally used for sputtering and the plasma etch process is among the most expensive equipment that is used in a semiconductor processing environment. The invention teaches a method of creating thin film interconnect patterns by eliminating the use of this equipment. To achieve this objective, the invention takes advantage of the swell and edge step, the electroless step, the semi-additive plating step and the microetch step of metal deposition that is typically used in conventional printed circuit board manufacturing. The above steps are combined with using the capability of building up of the board's capability by coating a surface with a thin epoxy film (by a liquid or dry film approach). Furthermore, in the conventional thin film process, the polyimide material or the BCB material is used. Both materials are very expensive. In this invention, an epoxy based material is used as the dielectric, which is much less expensive than the polyimide and the BCB material. Also, no Cr or Ti etching is required. This approach creates thin film interconnect lines. A thin coating is required in order to maintain a controlled impedance for the signal interconnect lines. For lines that are 16 um wide, the thickness of the underlying layer of dielectric should be about 10 to 12 um. Where a narrower line is required, a thinner film must be created. A wider line on the other hand requires a thicker layer of underlying dielectric. The method of the invention is further detailed in FIG. 2.

Where the process of the invention refers to an epoxy base material this reference in meant to be interpreted as covering all materials that fall within this category. The material can therefore be selected from the group of epoxy based materials such as Ciba Probelec 81 or its equivalent and epoxy based Macu Via (provided by the MacDermid Corporation) or its equivalent and Via Lux 81 (provided by Du Pont) or its equivalent and PDD 9015 (provided by Enthone-OMI) or its equivalent and Dyna Via (provided by the Shipley Ronal Corporation) or its equivalent or Hitachi 679 or its equivalent or any other suitable epoxy based material.

Figure 2A:
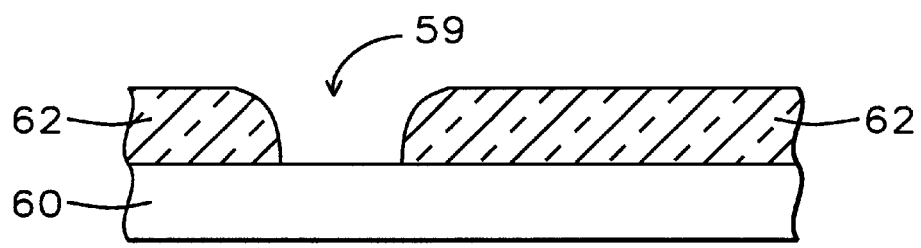
FIG. 2 shows a first sequence of processing steps of the invention for the thin film deposition process.

The process of the invention therefore again starts with a layer 62 of dielectric that has been deposited on the surface 60 of a substrate and with vias 59 opened in it, see FIG. 2a.

Figure 2B:
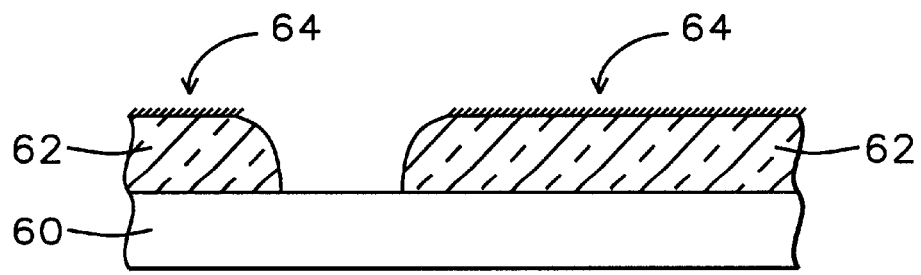

FIG. 2b, the next step of the invention is to perform a swell and etch step to the surface 64 of the layer 62 of dielectric. This swell and etch step creates roughness in the surface 64 of the dielectric layer 62, which enhances adhesion between the surface 64 of the dielectric layer 62 and the layer of metal that is to be created on the surface of the dielectric.

Figure 2C:
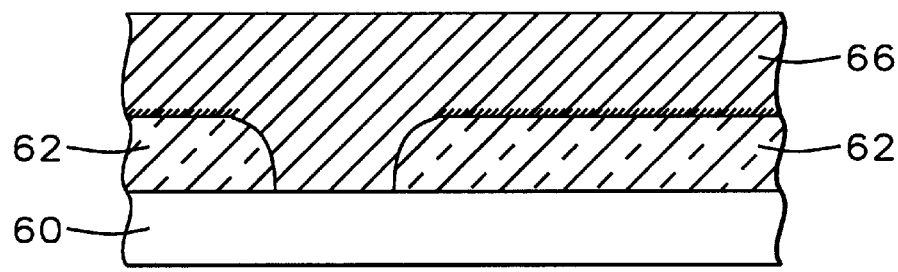

FIG. 2c, an electroless seeding creates a thin layer 66 of metal that is required for the plating steps. The electroless seeding step has the advantage that no expensive vacuum sputter equipment is required to create layer 66. In addition, the step of electroless seeding requires roughness of the surface of dielectric layer 62 for metal adhesion but does not cause the deposited metal to penetrate the surface of the underlying layer 62 of dielectric thereby eliminating the need for a plasma etch (that is used during conventional thin film processing for the creation of interconnect lines, as indicated above) to remove metal ions from the top layer of the layer 62 of dielectric. The thin layer 66 serves the function of being a base for the subsequent process of semi-additive plating, the semi-additive plating is part of the process of creating the interconnect line pattern.

Figure 2D:
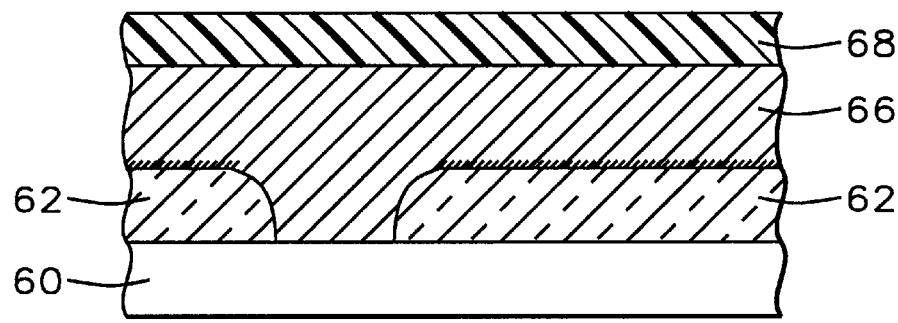

FIG. 2d shows a cross section after a layer 68 of photoresist is deposited over the surface of the electroless copper plating seed 66. This layer 68 of photoresist is masked and patterned creating the pattern of the interconnect lines.

Figure 2E:
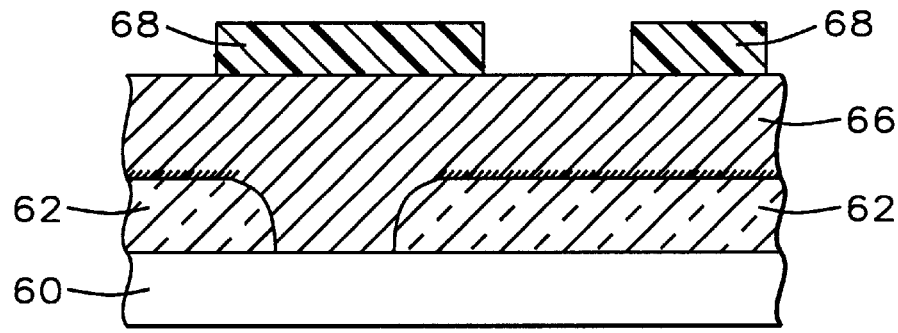

FIG. 2e shows a cross section after the layer 68 of photoresist has been developed.

Figure 2F:
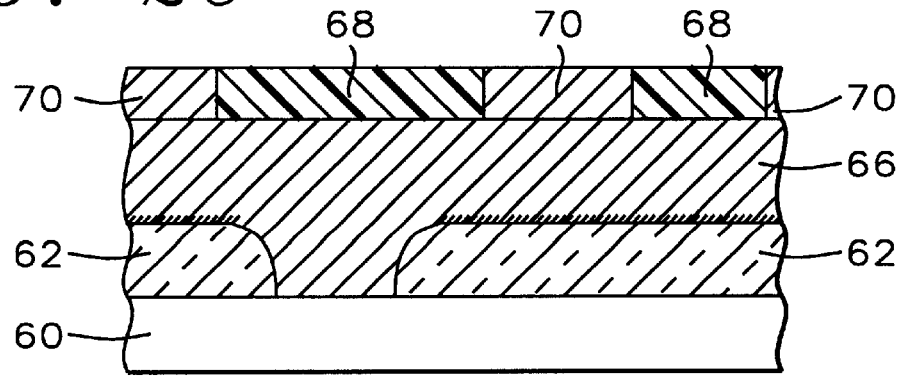

The process of semi-additive plating 70, FIG. 2f, can then be performed by depositing Cu in the openings that have been created in the layer 68 of photoresist. This plating 70 plates the surface of the interconnect lines that are to be created for the interconnect pattern.

Figure 2G:
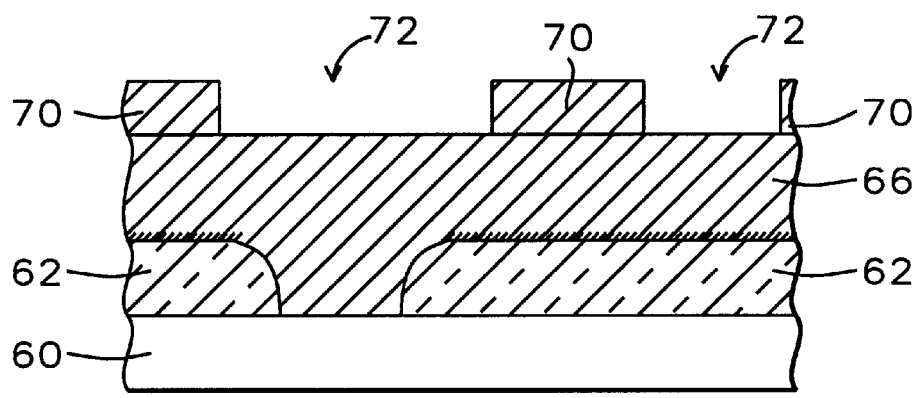

FIG. 2g shows a cross section after the photoresist mask layer 68, that has been used as a mask for the semi-additive plating of the interconnect pattern, has been removed. The areas that have been highlighted as areas 72 are the regions within the metal plating base 66 where the metal has to be removed in order to create the interconnect line patterns.

Figure 2H:
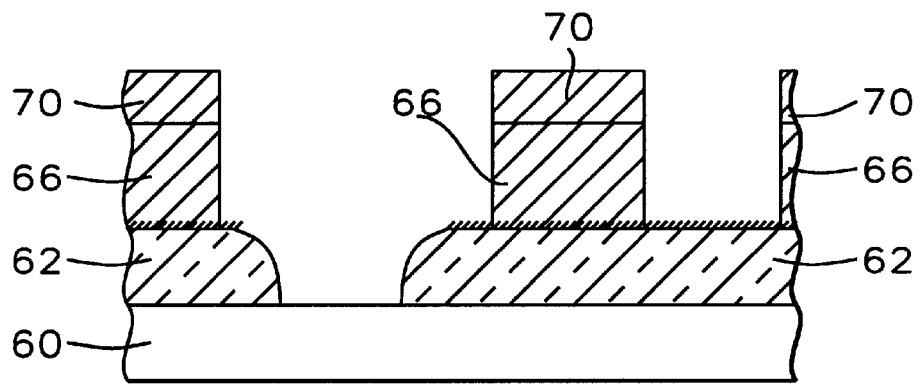

FIG. 2h, shows a cross section after completion of the wet etch to remove the sputtered plating base in regions 72, FIG. 2e, from between the interconnect pattern 66.

Figure 2I:
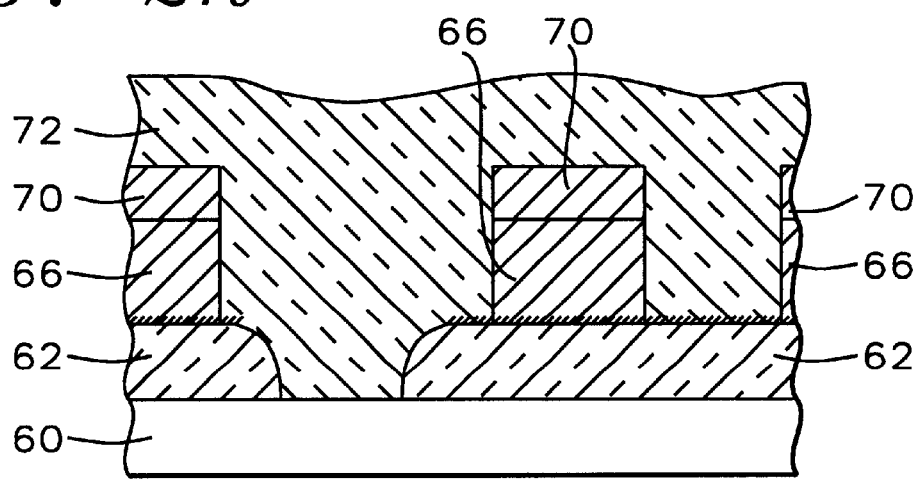

FIG. 2i shows a cross section after a coating 72 of dielectric has been created over the interconnect pattern 66/70.

Figure 2J:
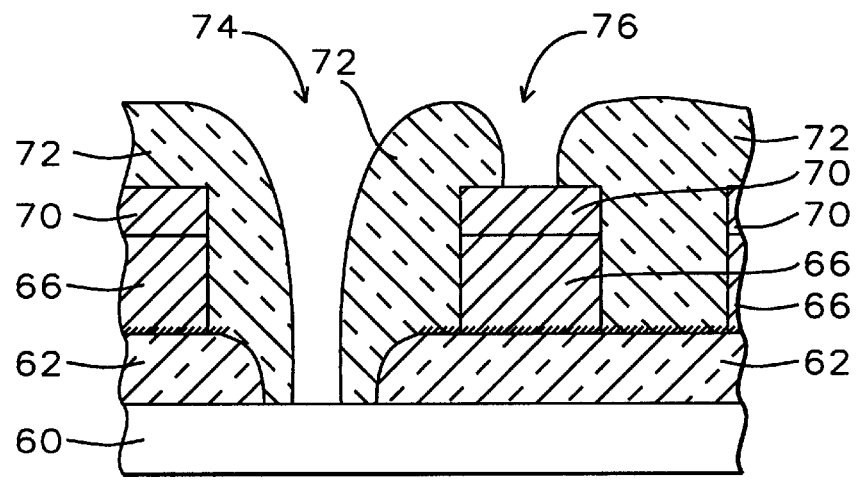

FIG. 2j shows a cross section after a via pattern 74/76 has been created in the dielectric layer 72.

For applications where electrical connections need to be made to the interconnect pattern 66/70, the above dielectric forms a solder mask and vias are created in the dielectric for the electrical connections.

Alternatively, another process of the invention, as shows in FIGS. 3a through 3d. The method shown under FIG. 3 is the method of plating and wet etch, this as opposed to the method that has been explained under FIG. 2 which is the semi additive method. Compared with the semi additive method (FIG. 2), the panel plating and wet etch method (FIG. 3) is easier to process and is therefore less costly. However, using the panel plating and wet etch method of FIG. 3 results in a line density that is not as high as the line density that is achieved using the semi additive method of FIG. 2.

Figure 3A:
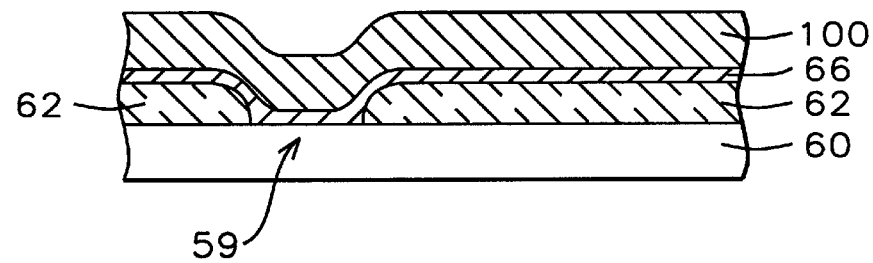
FIG. 3 shows a second sequence of processing steps of the invention.

FIG. 3a shows how this process starts with a layer 62 of dielectric that has been deposited on the surface 60 of a substrate. A via 59 is made through the layer 62 of dielectric. The next step is to do a swell and etch process (applied to the surface of the dielectric layer 62) followed by the step of electroless seeding, thereby creating the thin metal layer 66 as shown in FIG. 3a. The metal layer 100 that is shown in FIG. 3a is deposited by the method of electrolytic panel plating. The uniformity of this layer 100 is excellent due to the uniform plating current distribution on the panel surface.

Figure 3B:
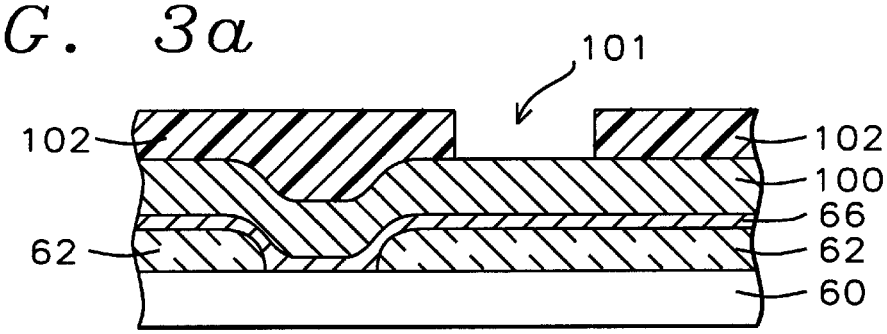

FIG. 3b shows how the metal layer 100 can be patterned into interconnect line features by using a patterned photoresist layer 102 and then chemically etching away the metal plating layer 100 and the metal plating base 66. The patterning of layer 102 has created an opening 101 in the layer of photoresist.

Figure 3C:
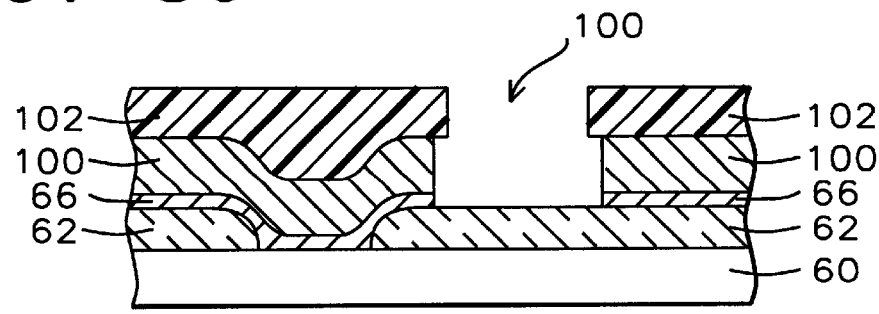

FIG. 3c shows a cross section after the plating layer 100 and the underlying layer 66 of plating base have been etched away in accordance with the opening 101 that has been created in the layer 104 of photoresist. Subsequently, the photoresist layer 102 is stripped and isolated interconnect lines can be formed. These interconnect lines form electrical connections with the metal layers 66 and 100 by means of metal that is deposited into opening 100, FIG. 3c.

This process can be repeated for additional metal layers that are build up on the substrate.

The bond pads can be finished with electroless Ni/Au or electrolytic Ni/Au.

Figure 3D:
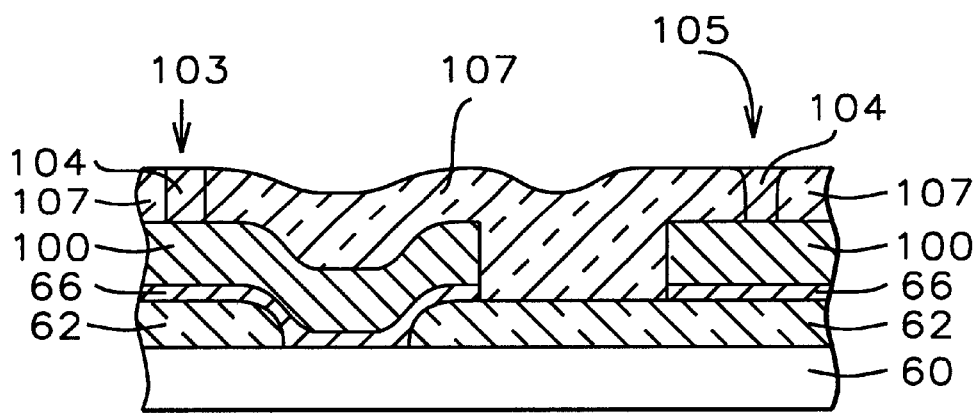

FIG. 3d is a cross section where the electroless Ni/Al plating 104, FIG. 3d, has been deposited. The cross section of FIG. 3c can be used to detail this processing step, the layer 102 of photoresist is removed from the surface of the metal layer 100. A dielectric layer 107 is deposited over the layers 100 which are copper pads, this layer 107 is patterned with vias using standard methods of photolithography of exposing and developing, creating openings 103 and 105 in the layer 107 of the dielectric thereby creating the copper pads 100 in the openings 103 and 105. The electroless Ni/Au plating 104, FIG. 3d, can now be deposited on the exposed copper pads 100 in the openings in layer 102 of photoresist before copper interconnect layer is etched (FIG. 3c).

Figure 3E:
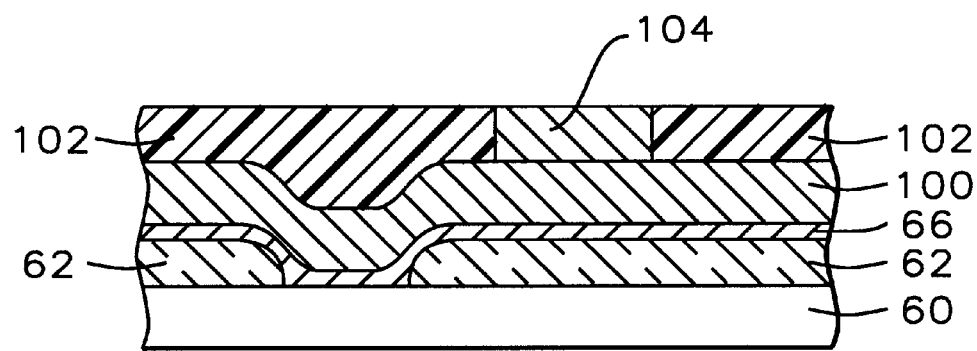

For the electrolytic Ni/Au plating, the Ni/Au plating 108 can be deposited within the opening 101 (FIG. 3b) that has been created in the layer 102 of photoresist before the etching of metal layers 100 and 66 is performed, an etching the results of which have been shown in FIG. 3c. A cross section after the electrolytic Ni/Au finishing of the bond pads (and, as stated, before the etch of the metal layers 100 and 66 but after creating the opening 101 shown in FIG. 3b in the layer 102 of photoresist) is shown in FIG. 3e.

The examples that have been shown in FIG. 2 and FIG. 3 represent one interconnect layer that has been created in accordance with the process of the invention. It must be pointed out that, where the example of FIG. 2 shows the creation of only one layer of thin film, the invention is not limited to one layer of thin film. A number of thin film layers can be superimposed, dependent on and determined by design packaging requirements. Where limitations arise in the number of overlying layers of thin film that can be applied, these limitations are not limitations that are imposed by the invention but are rather conventional limitations of thin film deposition technology or electrical performance characteristics. The last layer created in this manner must provide the interconnects with the surrounding structure and must therefore be coated as a solder mask. A top metallurgy of Ni and Au is often used for the connection.

The above process of swell and etch (of layer 62, FIG. 2 and FIG. 3) and electroless seeding (of layer 66. FIG. 2 and FIG. 3) has been successfully applied on dielectric surfaces (layer 62, FIG. 2 and FIG. 3) that contain an epoxy material such as FR4 or FR5 of the BT type of material or other materials of the epoxy family. The dielectric layers that are typically used for thin film interconnect dielectrics such as polyimide or BCB materials, do not provide good metal adhesion to the overlying layer of interconnect lines. Glass epoxy that is typically used for the manufacturing of printed circuit boards, also does not lend itself the electroless process of the invention because layers made of these materials are typically too thick to be successfully applied for the creation of thin films. (The minimum thickness of glass epoxy is about 2 mils while thin film interconnect lines have a line width of about 16 um, which requires a dielectric thickness of about 12 um in order to maintain a characteristic impedance of 50 ohms).

Recently developed low cost materials that can be used to build up layers on the surface of a printed circuit board (layer 62, FIG. 2) are available in both liquid form and in dry film form. For instance, the commercially available Ciba Probelec 81 is an epoxy based material that is available in liquid form and can be used for coating of surfaces. Where conventional coating have a thickness of about 50 to 75 um, special thin coating (about 12 um) have been successfully used for the creation of thin film layers on metal panels of excellent quality. Ciba Probelec 81 has been used as a base for electroless seeding with good results, this material allows for good rough surface under the electroless seeding process and metal adhesion to this surface has therefore proven to be excellent. It has further been demonstrated that the electroless plating process can create a dense thin metal film (layer 66, FIG. 2) of about 40 to 50 micro-inches thickness over the surface of layer 62, FIG. 2, a thickness that lends itself well to electroplating and the subsequent wet etch to remove the plating base without however having to apply the (expensive) plasma etch (to remove the top surface of the underlying dielectric layer). Other epoxy base materials, which can be used for the application of thin coatings in the range from between about 12 um and 50 um, which are required for the creation of overlying high density interconnect lines, are the commercially available Macu Via (available from the MacDermid Corporation), Via Lux (provided by the Du Pont Corporation), PDD9015 (provided by Enthone) and Dyna Via (provided by Shipley Ronal).

To recap: the novelty of the invention is that the invention teaches a combination of several known techniques that are being used in the manufacturing of Printed Circuit Boards and build-up board processes. By using the processes of the invention, a thin film interconnect structure can be created that is low cost and that eliminates the need for (expensive) sputter and plasma etch steps. The combination of the invention is a thin epoxy coating (with a thickness of between about 10 um or less and about 50 um or more), the use of swell and etch processing, electroless seeding and plating to form the plating base and the use of micro etching to remove the plating base.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for building a high density thin film interconnect structure, comprising the steps of:

depositing a first layer of dielectric over a substrate;

creating a via pattern in the dielectric layer if needed; applying a swell and etch process to the surface of said first layer of dielectric;

depositing an interconnect plating base by electroless seeding of Cu;

depositing a layer of photoresist over the surface of said deposited layer of interconnect plating base;

masking and patterning said layer of photoresist in the reverse pattern of the interconnect lines for additive plating of the interconnect structure thereby creating a photoresist plating mask;

depositing additive plating of the interconnect structure by depositing Cu;

removing said photoresist plating mask that has been used for said additive plating of said interconnect structure;

wet etching to remove the interconnect plating base from between said interconnect structure said wet etching using micro-etch processes of the printed circuit board technology;

coating the created interconnect structure with a dielectric; and creating vias in the dielectric for connections to an overlying metal layer said creating vias using photo-imaging and developing methods applied to photo-sensitive dielectric or by using laser ablation process of the printed circuit board technology.

2. The method of claim 1 wherein said substrate is a substrate selected from the group comprising a printed circuit board and a semiconductor substrate and a metal panel and a substrate that is contained within the construction of a printed wiring board, ceramic and glass panel.

3. The method of claim 1 wherein said method is extended to include the mounting of one or more Integrated Circuit devices by creating an interface substrate overlying said substrate, comprising the steps of:

providing one or more IC devices said IC devices having been provided with pads for electrical connections;

providing s substrate said substrate having a first surface and a second surface;

cleaning said first surface of said substrate;

depositing said first layer of dielectric over said first surface of said substrate;

creating said interconnect structure of one or more interconnect metal and dielectric layers over the surface of said first layer of dielectric said interconnect structure having a first and a second surface whereby said second surface of said interconnect structure essentially abuts to said first surface of said metal substrate;

coating said first surface of said interconnect structure as a solder mask;

exposing metal pads within said surface of said interconnect structure thereby creating openings for electrical connections;

masking and etching said second surface of said metal substrate thereby creating one or more openings for the insertion of said one or more IC devices thereby furthermore exposing portions of said dielectric within said openings;

selectively creating openings in said exposed dielectric thereby providing electrical access and heat removal to said second surface of said interconnect structure for said one or more IC devices;

depositing electroless Ni/Au in the openings on the exposed copper pads for IC bonding if required;

subdividing said metal substrate into individual IC substrates;

coating said exposed first layer of dielectric of said individual IC substrates with a layer of adhesive for wire bonding application;

inserting said one or more IC devices into said one or more openings for the insertion of said IC devices in said individual IC substrates whereby said IC devices overlay said adhesive coating for the wire bonding applications;

electrically connecting said IC devices to said selectively created openings in said dielectric by wire bond or solder reflow for the flip chip;

inserting a molding compound or under fill for the flip chip over said one or more IC devices within said one or more openings for the insertion of said IC devices; and electrically connecting said metal pads within said first surface of said interconnect structure to surrounding electrical interfaces.

4. The method of claim 3 wherein said coating said exposed first layer of dielectric of said individual IC substrates with a layer of adhesive whereby the application adhesive can be skipped for flip chip application by connecting said IC chip to said IC substrate by solder reflow join.

5. The method of claim 3 wherein said depositing electroless Ni/Au in the openings on the exposed copper pads for IC bonding whereby electroless Ni/Au can be replaced by electrolytic Ni/Au finish and the electrolytic Ni/Au plating shall be conducted after an additional photoresist coating and masking process and prior to electroless copper plating base to be removed by micro-etch method.

6. The method of claim 1 wherein said inner layer of dielectric is an epoxy based dielectric film with or without glass fiber reinforcement whereby said epoxy based dielectric film is provided with a curtain coating or screen printing or spin coating or extrusion or slit coating or hot roll lamination or press lamination said coating being provided for the creation of the overlying thin film interconnect structure.

7. The method of claim 1 wherein said first layer of dielectric is applied to a thickness between about 7 um and 100 um.

8. The method of claim 1 wherein said plating base is deposited using electroless seeding to a thickness between about 10 and 70 micro inches.

9. The method of claim 1 wherein said layer of dielectric contains material that is selected form the group of epoxy based materials.

10. The method of claim 1 wherein said high density thin film interconnect structure is further extended to include more than one layer whereby each layer containing said high density thin film interconnect structure whereby each of said layers is created in accordance with the processing steps of claim 1.

11. A method for building a high density thin film interconnect structure, comprising the steps of:

depositing a first layer of dielectric over a substrate surface;

creating a via pattern in said dielectric layer if needed;

applying a swell and etch process to the surface of said first layer of dielectric;

depositing an interconnect plating base by consecutive electroless seeding of Cu;

depositing a layer of electrolytic Cu panel plating over the whole substrate;

depositing a layer of photoresist over the surface of said deposited layer of interconnect plating base;

masking and patterning said layer of photoresist in the pattern of the interconnect lines;

subtractively wet etching into the panel plated Cu using a chemical etch process;

removing said photoresist mask;

coating the created interconnect pattern with a dielectric; and creating vias in the dielectric for connections to the overlying metal layer said creating vias using photo-imaging and developing methods applied to photosensitive dielectric or using the laser ablation process of the printed circuit board technology.

12. The method of claim 11 wherein said substrate is a substrate that is selected from the group comprising a printed circuit board and a semiconductor substrate and a metal panel and a substrate that is contained within the construction of a printed circuit board, ceramic and glass.

13. The method of claim 11 wherein said method is extended to include the mounting of one or more Integrated Circuit devices by creating an interface substrate overlying said substrate, comprising the steps of:

providing one or more IC devices said IC devices having been provided with pads for electrical connections;

providing a substrate said substrate having a first surface and a second surface;

cleaning said first surface of said metal substrate; depositing said first layer of dielectric over said first surface of said substrate;

creating said interconnect structure of one or more interconnect metal and dielectric layers over the surface of said layer of dielectric said interconnect structure having a first and a second surface whereby said second surface of said interconnect structure essentially abuts to said first surface of said metal substrate;

coating said first surface of said interconnect structure as a solder mask;

exposing metal pads within said first surface of said interconnect structure thereby creating openings for electrical connections;

masking and etching said second surface of said metal substrate thereby creating one or more openings for the insertion of said one or more IC devices thereby furthermore exposing portions of said first layer of dielectric within said openings;

selectively creating openings in said exposed dielectric thereby providing electrical access and heat removal to said second surface of said interconnect structure for said one or more IC devices;

depositing electroless Ni/Au in the openings on the exposed copper pads for IC bonding if required;

subdividing said substrate into individual IC substrates;

coating said exposed first layer of dielectric of said individual IC substrates with a layer of adhesive for wire bonding applications;

inserting said one or more IC devices into said one or more openings for the insertion of said IC devices in said individual IC substrates whereby said IC devices overlay said adhesive coating for wire bonding applications;

electrically connecting said IC devices to said selectively created openings in said dielectric by wire bond or solder reflow for a flip chip;

inserting a molding compound or underfill for the flip chip over said one or more IC devices within said one or more openings for the insertion of said IC devices; and electrically connecting said metal pads within said first surface of said interconnect structure to surrounding electrical interfaces.

14. The method of claim 13 wherein said coating said exposed first layer of dielectric of said individual IC substrate with a layer of adhesive whereby the application adhesive can be skipped for flip chip applications by connecting IC chip to IC substrate by solder reflow join.

15. The method of claim 13 wherein said depositing electroless Ni/Au in the openings on the exposed copper pads for IC bonding whereby electroless Ni/Au can be replaced by electrolytic Ni/Au finish and the electrolytic Ni/Au plating shall be conducted after an additional photoresist coating and masking process and prior to electroless copper plating base to be removed by micro-etching method.

16. The method of claim 11 wherein said inner layer of dielectric is an epoxy based dielectric film with or without glass fiber reinforcement whereby said epoxy based dielectric film is provided with a curtain coating or screen printing or spin coating or extrusion coating or slit coating or hot roll lamination coating or press lamination said coating being provided for the creation of the overlying thin film interconnect structure.

17. The method of claim 11 wherein said first layer of dielectric is applied to a thickness between about 7 um and 100 um.

18. The method of claim 11 wherein said plating base is deposited using electroless seeding to a thickness between about 10 and 70 micro inches.

19. The method of claim 11 wherein said layer of dielectric contains material that is selected from the group of epoxy based materials.

20. The method of claim 11 wherein said high density thin film interconnect structure is further extended to include more than one layer whereby each layer containing said high density thin film interconnect structure whereby each of said layers is created in accordance with the processing steps of claim 1.

* * * * *